United States Patent
Rios et al.

(10) Patent No.: US 10,115,822 B2
(45) Date of Patent: Oct. 30, 2018

(54) METHODS OF FORMING LOW BAND GAP SOURCE AND DRAIN STRUCTURES IN MICROELECTRONIC DEVICES

(71) Applicant: INTEL CORPORATION, Santa Clara, CA (US)

(72) Inventors: Rafael Rios, Portland, OR (US); Roza Kotlyar, Portland, OR (US); Kelin Kuhn, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/909,981

(22) PCT Filed: Sep. 26, 2013

(86) PCT No.: PCT/US2013/061832
§ 371 (c)(1),
(2) Date: Feb. 3, 2016

(87) PCT Pub. No.: WO2015/047264
PCT Pub. Date: Apr. 2, 2015

(65) Prior Publication Data
US 2016/0181424 A1    Jun. 23, 2016

(51) Int. Cl.
*H01L 29/66* (2006.01)
*H01L 29/78* (2006.01)
(Continued)

(52) U.S. Cl.
CPC .... *H01L 29/7848* (2013.01); *H01L 21/02532* (2013.01); *H01L 21/02535* (2013.01);
(Continued)

(58) Field of Classification Search
CPC .................................................. H01L 29/7848
(Continued)

(56) References Cited

U.S. PATENT DOCUMENTS

| | | | | |
|---|---|---|---|---|
| 4,590,502 A | * | 5/1986 | Morkoc | H01L 29/80 257/256 |
| 4,728,998 A | * | 3/1988 | Strain | H01L 21/26506 257/192 |

(Continued)

FOREIGN PATENT DOCUMENTS

| CN | 102810555 A | 12/2012 |
|---|---|---|
| CN | 103311306 A | 9/2013 |

(Continued)

OTHER PUBLICATIONS

Notification of Transmittal of the International Search Report and the Written Opinion of the International Searching Authority for PCT/US2013/061832 filed Sep. 26, 2013, dated Jul. 17, 2014, 17 pages.

(Continued)

*Primary Examiner* — Igwe U Anya
(74) *Attorney, Agent, or Firm* — Schwabe, Williamson & Wyatt, P.C.

(57) ABSTRACT

Methods of forming a strained channel device utilizing dislocations disposed in source/drain structures are described. Those methods/structures may include forming a source/drain region in a substrate of a device, and forming an alloy in the source/drain region, wherein the alloy comprises a material that decreases a band gap between source/drain contacts and the source/drain regions to substantially zero. The embodiments herein reduce an external parasitic resistance of the device.

22 Claims, 11 Drawing Sheets

(51) Int. Cl.
| | |
|---|---|
| *H01L 29/08* | (2006.01) |
| *H01L 29/165* | (2006.01) |
| *H01L 21/285* | (2006.01) |
| *H01L 21/02* | (2006.01) |
| *H01L 29/40* | (2006.01) |
| *H01L 29/417* | (2006.01) |
| *H01L 29/45* | (2006.01) |

(52) U.S. Cl.
CPC .... *H01L 21/28512* (2013.01); *H01L 29/0847* (2013.01); *H01L 29/165* (2013.01); *H01L 29/401* (2013.01); *H01L 29/41725* (2013.01); *H01L 29/45* (2013.01); *H01L 29/66477* (2013.01); *H01L 29/66795* (2013.01)

(58) Field of Classification Search
USPC .......................................................... 257/192
See application file for complete search history.

(56) References Cited

U.S. PATENT DOCUMENTS

| | | | | |
|---|---|---|---|---|
| 5,698,869 | A * | 12/1997 | Yoshimi | H01L 27/1203 257/192 |
| 6,342,408 | B1 * | 1/2002 | Oowaki | G11C 11/4091 257/E27.097 |
| 7,589,003 | B2 * | 9/2009 | Kouvetakis | B82Y 10/00 257/E21.092 |
| 2002/0188797 | A1 * | 12/2002 | Hsu | G06F 12/0893 711/104 |
| 2006/0186484 | A1 | 8/2006 | Chau | |
| 2008/0064153 | A1 | 3/2008 | Lo et al. | |
| 2011/0049613 | A1 * | 3/2011 | Yeh | H01L 29/66795 257/327 |
| 2011/0240998 | A1 * | 10/2011 | Morosawa | H01L 29/41733 257/57 |
| 2013/0154016 | A1 * | 6/2013 | Glass | H01L 29/78 257/368 |
| 2013/0183814 | A1 | 7/2013 | Huang et al. | |
| 2013/0288480 | A1 * | 10/2013 | Sanchez | H01L 21/02532 438/694 |
| 2014/0001520 | A1 * | 1/2014 | Glass | H01L 29/66439 257/288 |
| 2014/0048765 | A1 * | 2/2014 | Ma | H01L 29/78 257/12 |
| 2014/0054658 | A1 * | 2/2014 | Ma | H01L 21/26506 257/288 |
| 2014/0138744 | A1 * | 5/2014 | Kotlyar | H01L 29/785 257/192 |
| 2016/0064221 | A1 * | 3/2016 | Colinge | H01L 29/1033 257/192 |

FOREIGN PATENT DOCUMENTS

| | | |
|---|---|---|
| TW | 201110352 A1 | 3/2011 |
| TW | 201331997 A1 | 8/2013 |

OTHER PUBLICATIONS

Office Action (including Search Report) from Taiwan Intellectual Property Office (the IPO) dated Dec. 28, 2015 for Taiwan Patent Application No. 103132989 and English Translation thereof.
Communication of the European Patent Office for European Patent Application 13 894 549.8 dated Feb. 2, 2017, 8 pages.
Vincent, B. et al., "Characterization of GeSn Materials for Future Ge pMOSFETs Source/Drain Stressors", Microelectronic Engineering, vol. 88, No. 4, Oct. 25, 2010, pp. 342-346.
Supplementary European Search Report dated May 17, 2017 from the European Patent Office for European Application No. 13894549. 8-1552/3050079 PCT/US2013/061832 (11 Pages).
Wang et al.: "Silicon-Germanium-Tin (SiGeSn) Source and Drain Stressors formed by Sn Implant and Laser Annealing for Strained Silicon-Germanium Channel P-MOSFETs", 2007 IEEE International Electron Device Meeting: Washington, DC, Dec. 10-12, 2007, Piscataway, NJ, USA, Dec. 10, 2007, pp. 131-134, XP031389629, ISBN: 98-1-4244-1507-6.
Vincent B et al.: "Characterization of GeSn materials for future Ge pMOSFETs source/drain stressors", Microelectronic Engineering, vol. 88, No. 4, Oct. 25, 2010, pp. 342-346, XP028140791, ISSN: 0167-93, DOI: 10.1016/J.MEE.2010.10.025.
Office Action for Chinese Patent Application No. 201380079074.2 dated Mar. 5, 2018, 10 pages.
International Preliminary Report on Patentability for International Patent Application No. PCT/US2013/061832, dated Apr. 7, 2016, 11 pages.
Notice of Allowance from Taiwan Patent Application No. 103132989, dated Jun. 27, 2015, 2 pages.

\* cited by examiner

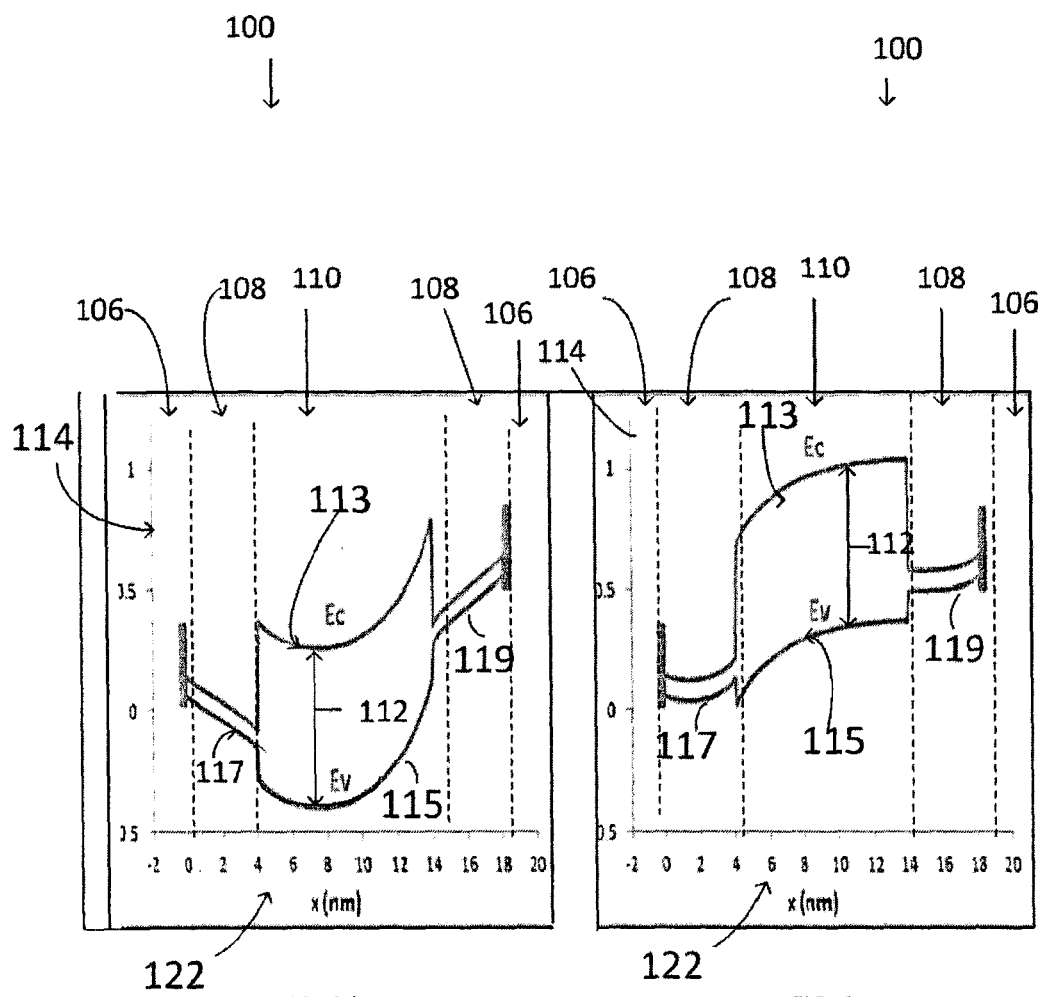

METHODS OF FORMING LOW BAND GAP SOURCE AND DRAIN STRUCTURES IN MICROELECTRONIC DEVICES

This patent application is a U.S. National Phase Application under 35 U.S.C. 371 of International Application No. PCT/US2013/061832 filed Sep. 26, 2013.

BACKGROUND OF THE INVENTION

As microelectronic devices continue to scale, the contact resistance of typical doped source drain structures increases as the contact dimension is reduced. At the same time, the channel resistance keeps reducing as channel lengths scale down. The result is that a proportionally larger voltage drop is induced in the parasitic source/drain regions leading to diminished improvement in device performance. There is a need to reduce the source/drain parasitic resistance, since it is rapidly becoming a bottleneck for device performance.

BRIEF DESCRIPTION OF THE DRAWINGS

While the specification concludes with claims particularly pointing out and distinctly claiming certain embodiments, the advantages of these embodiments can be more readily ascertained from the following description of the invention when read in conjunction with the accompanying drawings in which:

FIGS. 1a-1h represent top and cross-sectional views of structures according to various embodiments.

DETAILED DESCRIPTION OF THE PRESENT INVENTION

Figure 1A:
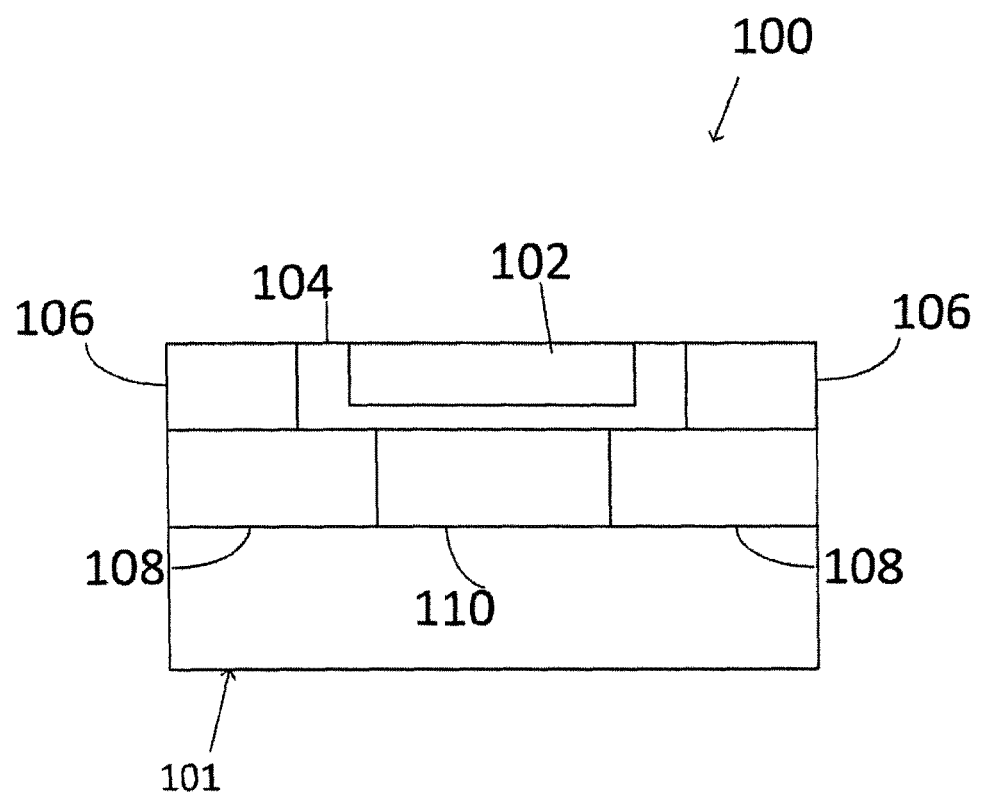

In the following detailed description, reference is made to the accompanying drawings that show, by way of illustration, specific embodiments in which the methods and structures may be practiced. These embodiments are described in sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from the spirit and scope of the embodiments. In addition, it is to be understood that the location or arrangement of individual elements within each disclosed embodiment may be modified without departing from the spirit and scope of the embodiments. The following detailed description is, therefore, not to be taken in a limiting sense, and the scope of the embodiments is defined only by the appended claims, appropriately interpreted, along with the full range of equivalents to which the claims are entitled. In the drawings, like numerals may refer to the same or similar functionality throughout the several views.

Methods and associated structures of forming and utilizing microelectronic structures, such as device structures comprising low source/drain band gap, are described. Those methods/structures may include forming a source/drain region in a substrate of a device, and forming an alloy in the source/drain region, wherein the alloy comprises a material that decreases a band gap between source/drain contacts and the source/drain regions to substantially zero. The embodiments herein reduce an external parasitic resistance of the device.

FIGS. 1a-1h illustrates views of embodiments of forming microelectronic structures, such as low band gap transistor/device structures, for example. FIG. 1a depicts a portion of a device 100, such as a portion of a transistor device 100, for example. In an embodiment, the device 100 may comprise a portion of one of a planar transistor, a multi-gate transistor such as a FINFET or tri-gate device, or a nanowire structure, and combinations thereof. The device 100 includes a gate structure 102, a gate dielectric 104 disposed between the gate structure 102 and a channel region 110, and source/drain contacts 106 coupled to source/drain regions 108. In an embodiment, the source/drain contacts may comprise metal source/drain contacts. The channel region 110 may be disposed between the source/drain regions 108 and underneath the gate structure 102 and may comprise a $Si_xGe_y$ composition, in some cases. In an embodiment, channel region 110 and the source/drain regions may comprise regions disposed in a substrate 101.

In an embodiment, the substrate 101 may comprise at least one of a silicon material, a non-silicon material, a single crystal silicon material, a polysilicon material, a piezoelectric material, material and/or other electromechanical substrate material. In an embodiment, the gate structure 102, may comprise a portion of a transistor gate structure 102, such as an NMOS or a PMOS transistor gate structure. In an embodiment, the source/drain regions 108 may comprise silicon fin structures, wherein the silicon fin structures, which may comprise portions of a three dimensional transistor structure such as a multi-gate structure. In an embodiment, the silicon fin structures may be separated from each other by a dielectric material (not shown), which may comprise a STI (shallow trench isolation) material in an embodiment.

Figure 1B:
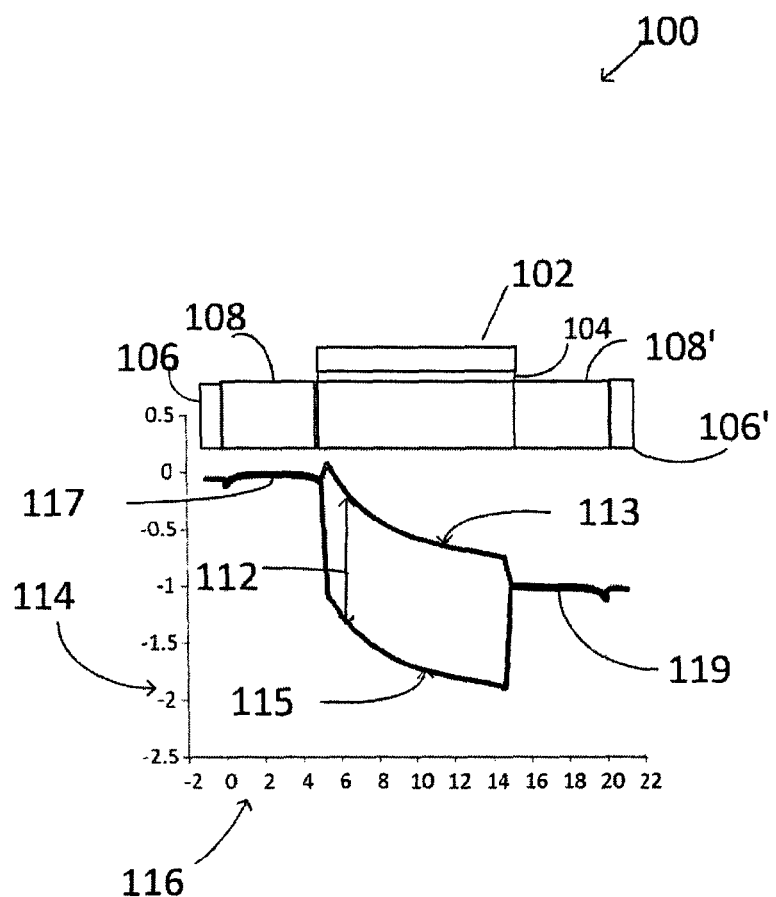

In an embodiment, the source/drain regions 108 may comprise silicon and/or germanium material alloyed with a material that reduces a band gap between the source/drain regions 108 and the source/drain contacts 106. In an embodiment, the band gap, Eg, may comprise below about 0.2 eV, and in some cases, may comprise substantially zero. In an embodiment, the source/drain regions 108 may be alloyed with a tin material. In an embodiment, the tin may form an alloy with the source/drain material that may comprise at least about 30 percent alloy by weight in the source/drain regions 108. In FIG. 1b, a portion of the device 100 is depicted with an energy band diagram below, wherein the x axis 114 describes a band energy in electron volts (eV), and the y axis 116 describes a distance across the device 100 in nanometers.

A band gap (Eg) 117, which may comprise an energy gap/barrier between a conduction band (Ec) 113 and a valence band (Ev) 115, between the source region 108 and the source/drain contact 106, and a band gap 119 between the drain region 108' and the source/drain contacts 106,' comprises substantially zero electron volts. This is due to the alloying with the alloy material, such as tin, in the source/drain regions 108, 108'. In an embodiment, the source/drain regions 108, 108' are dope-less, such that they comprise little to no doping elements.

In an embodiment, little to no energy barrier forms at the source/drain metal contacts 106, 106' interface. Instead, the energy barrier/band gap 112 moves to the interface between the alloyed source/drain regions 108, 108' and the channel region 110, wherein the band gap 112 is significantly higher at the channel 110-alloyed source/drain region 108, 108' interface than between the source/drain region 108, 108'-source/drain contact 106, 106' interface. In an embodiment, the band-gap 112 in the channel region 110 (channel band gap 112) may be controlled by a gate bias that may be applied to the gate structure 102. In an embodiment, the band gap 112 may comprise above about 1 electron volt or greater. In an embodiment, requirements for the barrier/band gap 112 may be less stringent than for those located at the source/drain contact metal 106, 106' interface, and good conduction may be achieved for a band offset smaller than about 0.2 eV.

Figure 5:
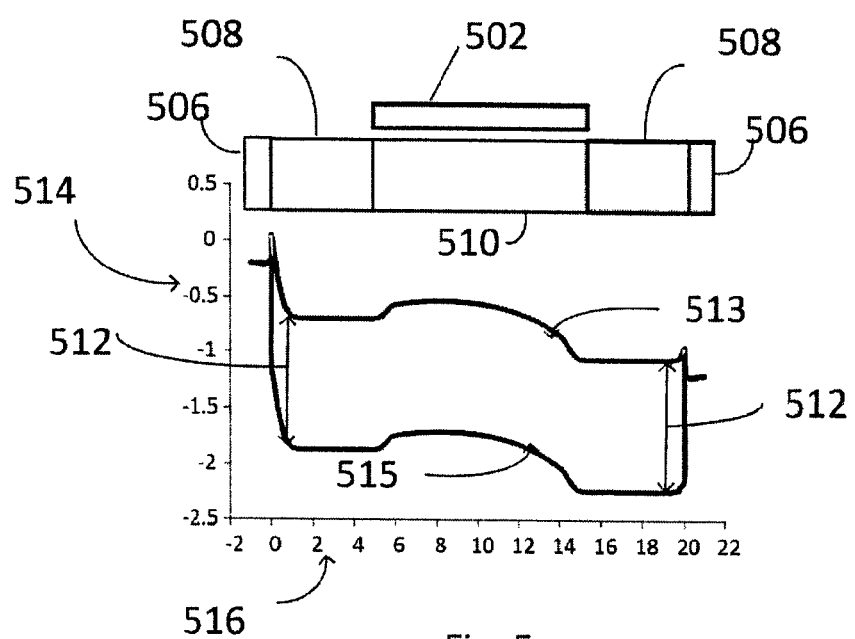
FIG. 5 represents a structure according to the Prior Art.

In typical prior art devices (FIG. 5a, Prior Art), the source/drain regions 508, 508' may comprise heavily doped regions, wherein the source/drain region 508, 508' material (such as silicon and/or germanium) may be doped with a dopant, such as p-type or n-type materials. In an embodiment, the channel region 510 may comprise an intrinsic (non-doped) or a slightly doped material, such as silicon or silicon germanium. In typical, prior art, source/drain regions 508, 508', a relatively large Schottky barrier/band gap 512 forms at the metal contacts 506, 506'. Carriers, such as electrons or holes, can go over the barrier/Eg 512 by thermionic emission if the barrier 512 is low enough, or the carriers can tunnel across if the source/drain regions 508, 508' are doped highly enough to produce short tunneling distances.

Referring back to FIG. 1a, the device 100 may comprise a gate bias in an ON state, wherein Vgs=Vds=1V, in an embodiment. In an embodiment, small or substantially zero band-gaps can be obtained for the device 100 by making metal or semimetal alloys with the source/drain 108. For example, incorporation of tin into the source/drain regions 108, which may comprise silicon, germanium or $Si_xGe_{1-x}$, in general, may result in alloys which comprise a greatly reduced and/or substantially zero Eg. In an embodiment, the source/drain regions 108 may comprise compositions of $Si_xGe_ySn_{1-x-y}$, and may comprise all possible combinations/concentrations of x and y values.

Figure 1C:
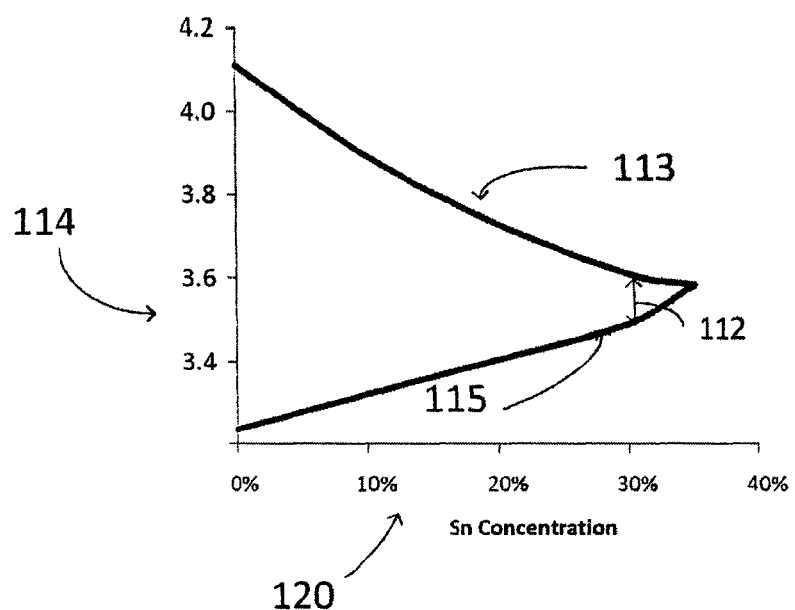

In an embodiment, tin concentrations of about thirty percent and above can result in a band gap 112 approaching zero, as shown in FIG. 1c, wherein a band gap between Ec 113 and Ev 115 approaches zero electron volts 114 as tin concentration 120 increases in the source/drain material. In an embodiment, conduction and valence band energies for germanium tin alloys may be reduced as tin concentrations increase. The band gap reduces as tin concentration increases for III-V based semiconductors, such as gallium arsenide, etc. as well. Furthermore, quantum confinement in thin semiconductor layers can be used to modulate Eg and work function of source/drain contact metal, providing a wide design space for device optimization.

FIG. 1d-1e shows the OFF- and ON-state band structures as traveled across a device 100 in nm 122, wherein the device 100 may comprise a hetero structure device, which may comprise a germanium tin source/drain region composition of about 30% tin concentration. In FIG. 1d, when the device 100 is in an OFF state (Vgs=0V, Vds=-0.5 V), the band gap 117, 119 between the Ec 113 and Ev 115 comprises substantially zero electron volts 114 at the contact metal 106-source/drain region 108 interface. The band gap 112 is much larger and located at the channel region 110-source/drain region 108 interface. In an embodiment, a contact metal with a work function of about 4.6 eV, which corresponds to the mid-gap energy of an intrinsic germanium channel, may be used for the source/drain contacts, wherein the channel may comprise intrinsic germanium. With this kind of work-function value, a prior art device with such a direct metal contact to intrinsic, non-alloyed germanium would give rise to a large Schottky barrier, rendering the prior art device useless.

On the other hand, the contact 106 to the low band gap, germanium tin alloy source/drain region 108 shows little to no conduction barrier. Instead, the barrier 112 is moved to the hetero channel interface that can be modulated by an overlapping gate field. FIG. 1e depicts the device 100 in an ON state (Vgs=Vds=-0.5V), wherein the band gap 117, 119 between the Ec 113 and Ev 115 comprises substantially zero electron volts 114 at the contact metal 106-source/drain region 108 interface. The band gap 112 is much larger and located at the channel region 110-source/drain region 108 interface.

Figure 1F:
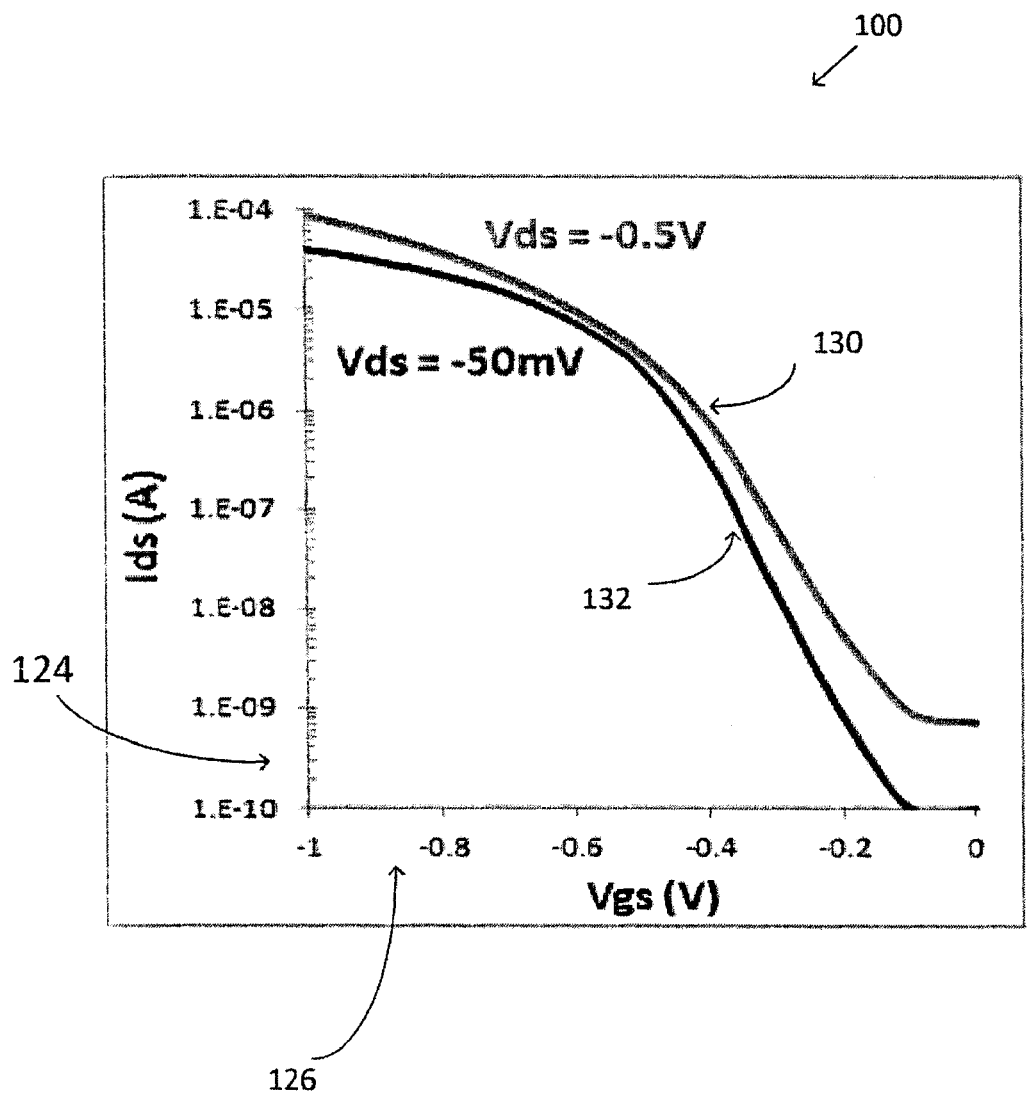

FIG. 1f depicts drain current behavior of a device 100, such as a PMOS device, according the embodiments herein where the source/drain regions are alloyed with a material that reduces the band gap to substantially zero. Ids 124 vs. Vgs 126 behavior is shown, wherein healthy drive currents and five orders of magnitudes Ion/Ioff ratios are observed. For example, a first Vds 130 is depicted comprising -0.5V, and a second Vds 132 is depicted comprising a -50 mV. In another embodiment, since there is no source/drain region doping determining a preferential carrier type as in conventional (metal oxide semiconductor field effect transistor) MOSFET devices, the embodiments may further include an ambipolar device that can be used for both carrier types. However, the Ev and Ec band offsets at the hetero (channel-source/drain) interface may determine which device type may possess favorable drive currents and Ion/Ioff ratios. The smaller Ev band offset as shown for the parameters in FIG. 1f indicates that the PMOS device may have better performance over a NMOS device. The particular device choice will depend upon the chosen parameters of the particular device and the particular design requirements, however.

Figure 1G:
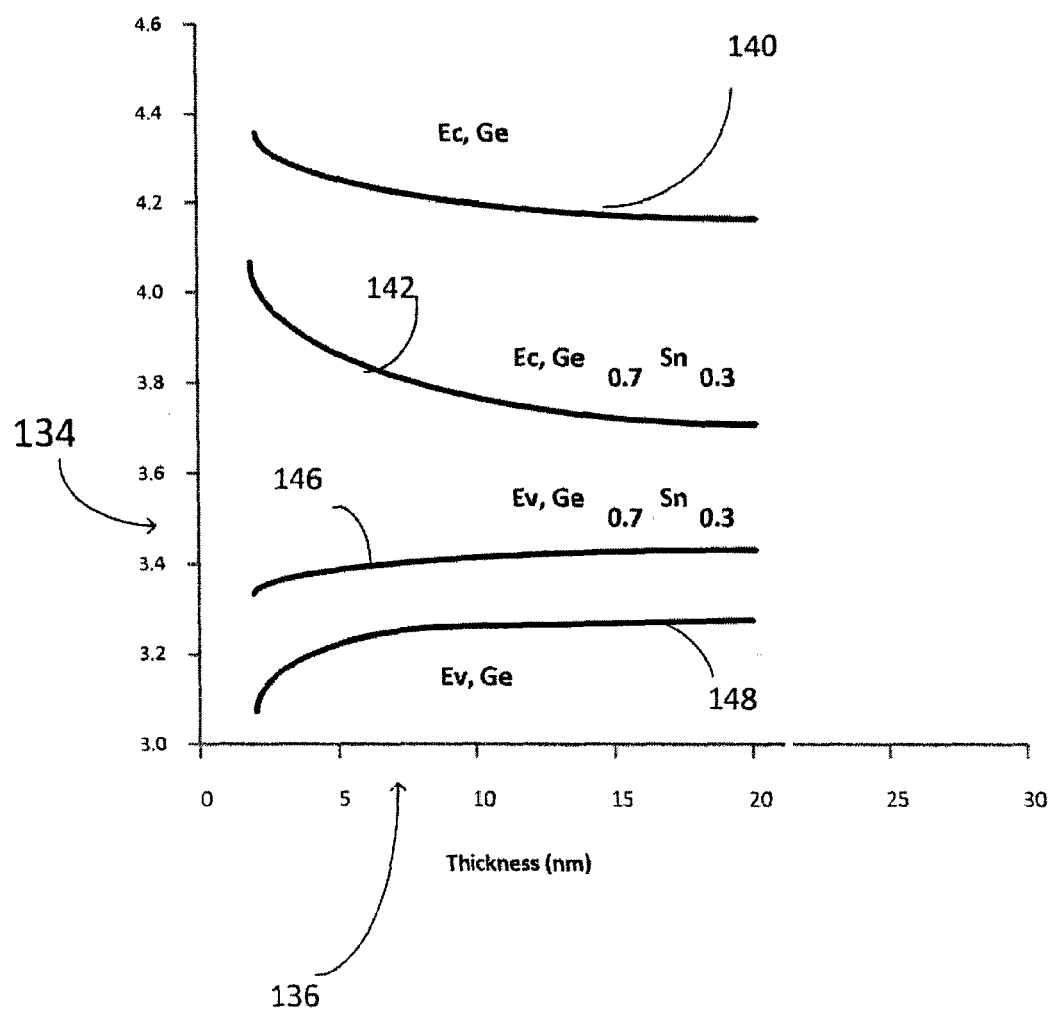
Figure 1H:
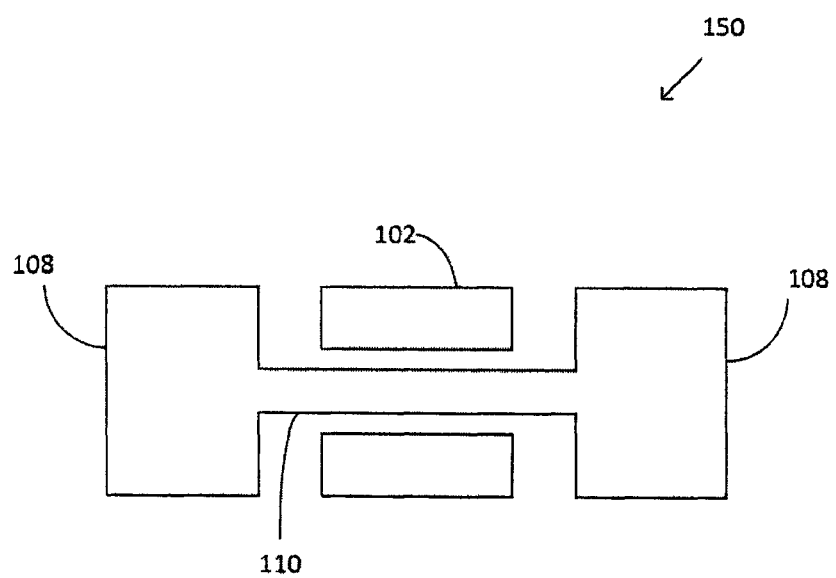

Another modulator of the band structure is the quantum confinement effect at small film thicknesses, which can also be exploited to design and optimize the performance of the various device embodiments herein. FIG. 1g shows the band characteristics in electron volts 134 of germanium (Ge) and $Ge_{0.7}Sn_{0.3}$ for different film thicknesses in nm 136. Ec for germanium 140 and for $Ge_{0.7}Sn_{0.3}$ 142 and Ev for germanium 146 and for $Ge_{0.7}Sn_{0.3}$ 148 are depicted FIG. 1g also reveals that a relatively large band-gap forms at thicknesses below 5 nm even for high tin concentrations in the source/drain alloy structures. Therefore, another device option is to use very high tin concentrations (or even pure tin) in the source/drain regions, with thick (unconfined) source/drain structures that comprise small band gap at the contact metal. Furthermore, thin (confined) channels with large band gaps may additionally be employed. In an embodiment (FIG. 1h), a $Ge_{0.7}Sn_{0.3}$ material can be used for source/drain 108 and channel 110 material in a device 150, with the confined channel 110 comprising a thickness of less than about 5 nm to form a channel band gap of more than about 0.5 eV, and a thick source/drain region 108 with small or zero source/drain band gap.

In an embodiment, the devices herein may comprise circuitry elements such as transistor structures including planar, trigate and nanowire transistor structures, and any other suitable circuitry elements. The circuitry elements may comprise logic circuitry for use in a processor die, for example. Metallization layers and insulative material may be included in the source/drain alloy structures herein, as well as conductive contacts/bumps that may couple metal layers/interconnects to external devices. The type of elements included in the devices herein may comprise any suitable type of circuit elements, according to the particular application.

Figure 2:
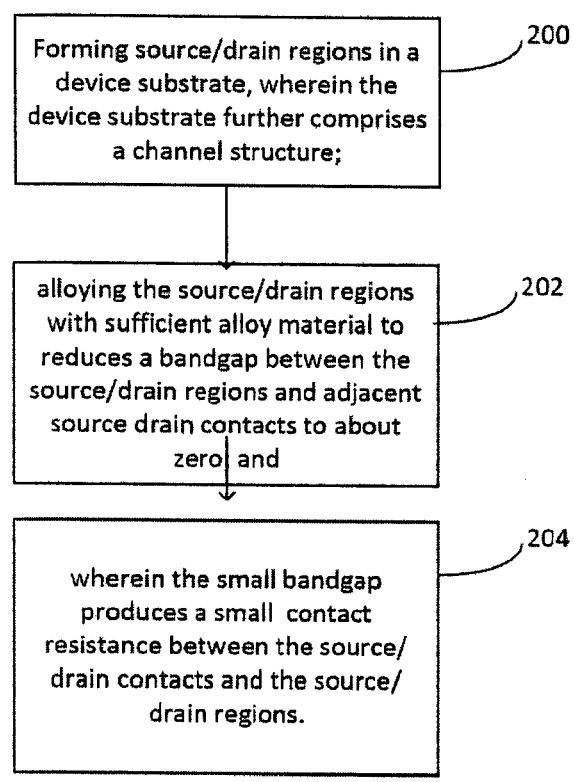
FIG. 2 represents a flow chart of a method according to embodiments.

FIG. 2 depicts a flow chart of a method according to embodiments. At step 200, source/drain regions may be formed in a device substrate, wherein the device substrate further comprises a channel structure. At step 202, the source/drain regions may be alloyed with enough alloy material to reduce the band gap to close to zero. In an embodiment, the alloy material may comprise tin. At step 204, the small band gap of the semiconductor alloy reduces a metal contact resistance, and produces a small metal contact resistance.

In an embodiment, the devices of the embodiments may be coupled with any suitable type of package structures capable of providing electrical communications between a microelectronic device, such as a die and a next-level component to which the package structures may be coupled (e.g., a circuit board). In another embodiment, the devices may be coupled with a package structure that may comprise any suitable type of package structures capable of providing electrical communication between a die and an upper integrated circuit (IC) package coupled with the device layer.

The device described in the various Figures herein may comprise a portion of a silicon logic die or a memory die, for example, or any type of suitable microelectronic device/die. In some embodiments the devices of the embodiments may further comprise a plurality of dies, which may be stacked upon one another, depending upon the particular embodiment. In some cases the device may be located/attached/embedded on either the front side, back side or on/in some combination of the front and back sides of a package structure. In an embodiment, the device(s) may be partially or fully embedded in a package structure.

The various embodiments of the devices herein enable reduction in the parasitic resistance by forming source/drain regions with small or zero band gap, Eg, resulting in little to no barrier at metal contacts. The small Eg also results in higher density of states that lowers the resistivity of the source/drain structures of the embodiments herein. The embodiments enable formation of complementary devices with no need of doping, wherein the source/drain regions are dope-less. Electron or hole conduction may be selected by appropriate design of the source/drain work-function to make a small conduction band Ec offsets for N-type, or small valence band Ev offsets for p-type devices.

Figure 3:
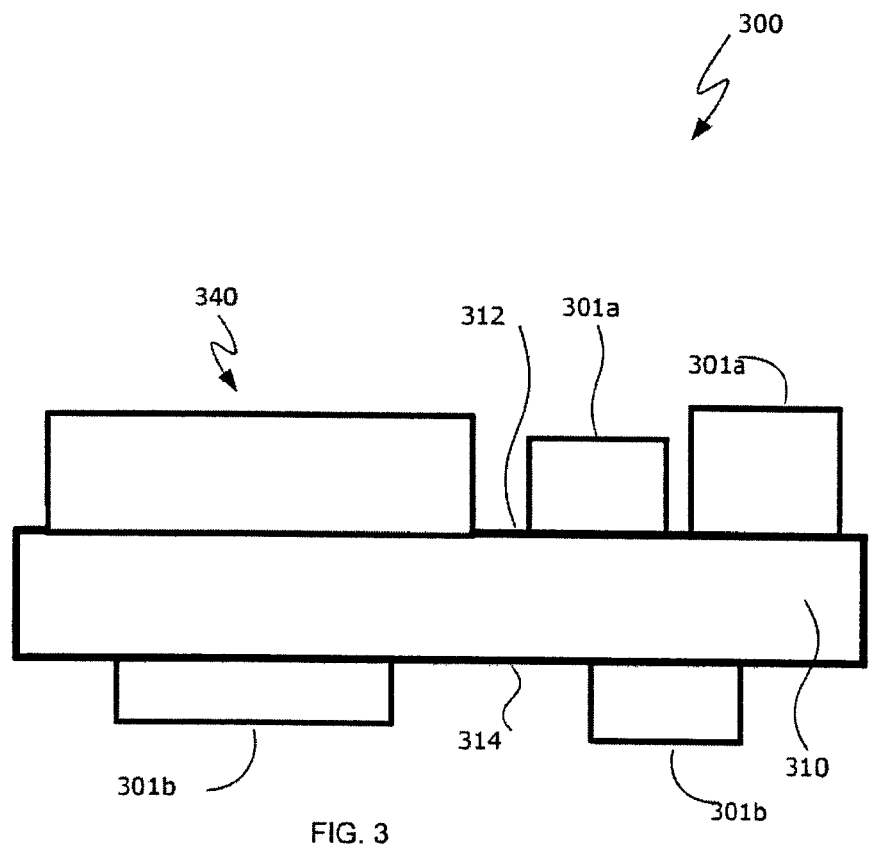
FIG. 3 represents a cross-sectional view of a system according to embodiments.

Turning now to FIG. 3, illustrated is an embodiment of a computing system 300. The system 300 includes a number of components disposed on a mainboard 310 or other circuit board. Mainboard 310 includes a first side 312 and an opposing second side 314, and various components may be disposed on either one or both of the first and second sides 312, 314. In the illustrated embodiment, the computing system 300 includes a package structure 340 disposed on the mainboard's first side 312, wherein the package structure 340 may comprise any of the device structures, such as the transistor device structures of the embodiments described herein.

System 300 may comprise any type of computing system, such as, for example, a hand-held or mobile computing device (e.g., a cell phone, a smart phone, a mobile internet device, a music player, a tablet computer, a laptop computer, a nettop computer, etc.). However, the disclosed embodiments are not limited to hand-held and other mobile computing devices and these embodiments may find application in other types of computing systems, such as desk-top computers and servers.

Mainboard 310 may comprise any suitable type of circuit board or other substrate capable of providing electrical communication between one or more of the various components disposed on the board. In one embodiment, for example, the mainboard 310 comprises a printed circuit board (PCB) comprising multiple metal layers separated from one another by a layer of dielectric material and interconnected by electrically conductive vias. Any one or more of the metal layers may be formed in a desired circuit pattern to route—perhaps in conjunction with other metal layers—electrical signals between the components coupled with the board 310. However, it should be understood that the disclosed embodiments are not limited to the above-described PCB and, further, that mainboard 310 may comprise any other suitable substrate.

In addition to the package structure 340, one or more additional components may be disposed on either one or both sides 312, 314 of the mainboard 310. By way of example, as shown in the figures, components 301a may be disposed on the first side 312 of the mainboard 310, and components 301b may be disposed on the mainboard's opposing side 314. Additional components that may be disposed on the mainboard 310 include other IC devices (e.g., processing devices, memory devices, signal processing devices, wireless communication devices, graphics controllers and/or drivers, audio processors and/or controllers, etc.), power delivery components (e.g., a voltage regulator and/or other power management devices, a power supply such as a battery, and/or passive devices such as a capacitor), and one or more user interface devices (e.g., an audio input device, an audio output device, a keypad or other data entry device such as a touch screen display, and/or a graphics display, etc.), as well as any combination of these and/or other devices.

In one embodiment, the computing system 300 includes a radiation shield. In a further embodiment, the computing system 300 includes a cooling solution. In yet another embodiment, the computing system 300 includes an antenna. In yet a further embodiment, the assembly 300 may be disposed within a housing or case. Where the mainboard 310 is disposed within a housing, some of the components of computer system 300—e.g., a user interface device, such as a display or keypad, and/or a power supply, such as a battery—may be electrically coupled with the mainboard 310 (and/or a component disposed on this board) but may be mechanically coupled with the housing.

Figure 4:
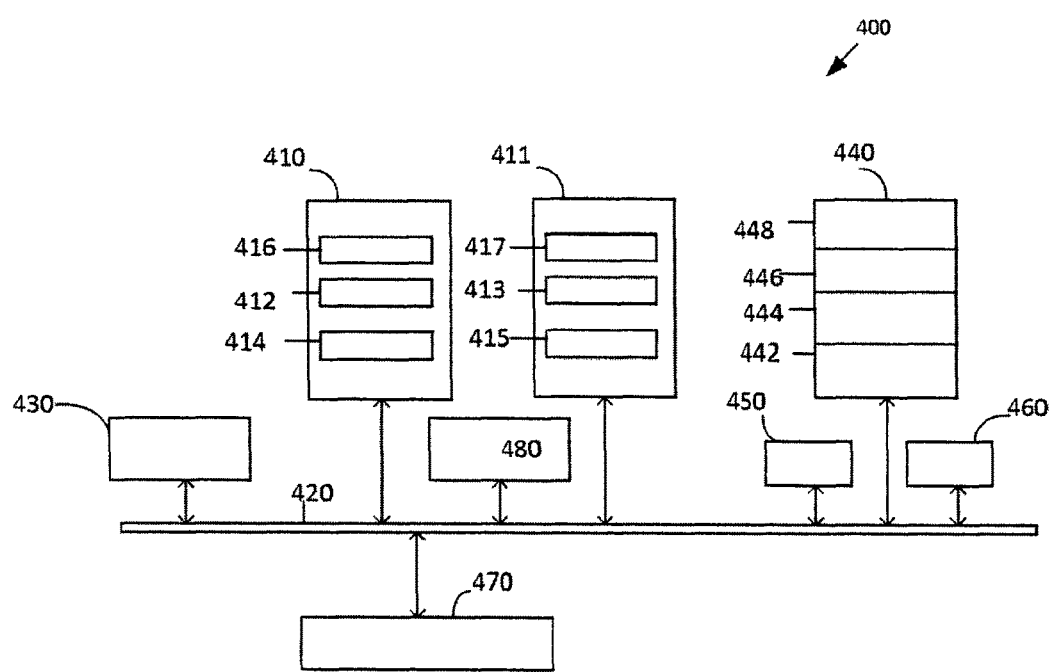
FIG. 4 represents a schematic of a system according to embodiments.

FIG. 4 is a schematic of a computer system 400 according to an embodiment. The computer system 400 (also referred to as the electronic system 400) as depicted can embody/include a package structure that includes any of the several disclosed device embodiments and their equivalents as set forth in this disclosure. The computer system 400 may be a mobile device such as a netbook computer. The computer system 400 may be a mobile device such as a wireless smart phone. The computer system 400 may be a desktop computer. The computer system 400 may be a hand-held reader. The computer system 400 may be integral to an automobile. The computer system 400 may be integral to a television.

In an embodiment, the electronic system 400 is a computer system that includes a system bus 420 to electrically couple the various components of the electronic system 400. The system bus 420 is a single bus or any combination of busses according to various embodiments. The electronic system 400 includes a voltage source 430 that provides power to the integrated circuit 410. In some embodiments, the voltage source 430 supplies current to the integrated circuit 410 through the system bus 420.

The integrated circuit 410 is electrically, communicatively coupled to the system bus 420 and includes any circuit, or combination of circuits according to an embodiment, including the package/device structures of the various embodiments included herein. In an embodiment, the integrated circuit 410 includes a processor 412 that can include any type of packaging structures including the dope-less transistor structures according to the embodiments herein. As used herein, the processor 412 may mean any type of circuit such as, but not limited to, a microprocessor, a microcontroller, a graphics processor, a digital signal processor, or another processor. In an embodiment, the processor 412 includes any of the embodiments of the package structures disclosed herein. In an embodiment, SRAM embodiments are found in memory caches of the processor.

Other types of circuits that can be included in the integrated circuit 410 are a custom circuit or an application-specific integrated circuit (ASIC), such as a communications circuit 414 for use in wireless devices such as cellular telephones, smart phones, pagers, portable computers, two-way radios, and similar electronic systems. In an embodiment, the processor 412 includes on-die memory 416 such as static random-access memory (SRAM). In an embodiment, the processor 412 includes embedded on-die memory 416 such as embedded dynamic random-access memory (eDRAM).

In an embodiment, the integrated circuit 410 is complemented with a subsequent integrated circuit 411. In an embodiment, the dual integrated circuit 411 includes embedded on-die memory 417 such as eDRAM. The dual integrated circuit 411 includes an RFIC dual processor 413 and a dual communications circuit 415 and dual on-die memory 417 such as SRAM. The dual communications circuit 415 may be configured for RF processing.

At least one passive device 480 is coupled to the subsequent integrated circuit 411. In an embodiment, the electronic system 400 also includes an external memory 440 that in turn may include one or more memory elements suitable to the particular application, such as a main memory 442 in the form of RAM, one or more hard drives 444, and/or one or more drives that handle removable media 446, such as diskettes, compact disks (CDs), digital variable disks (DVDs), flash memory drives, and other removable media known in the art. The external memory 440 may also be embedded memory 448. In an embodiment, the electronic system 400 also includes a display device 450, and an audio output 460. In an embodiment, the electronic system 400 includes an input device such as a controller 470 that may be a keyboard, mouse, touch pad, keypad, trackball, game controller, microphone, voice-recognition device, or any other input device that inputs information into the electronic system 400. In an embodiment, an input device 470 includes a camera. In an embodiment, an input device 470 includes a digital sound recorder. In an embodiment, an input device 470 includes a camera and a digital sound recorder.

Although the foregoing description has specified certain steps and materials that may be used in the methods of the embodiments, those skilled in the art will appreciate that many modifications and substitutions may be made. Accordingly, it is intended that all such modifications, alterations, substitutions and additions be considered to fall within the spirit and scope of the embodiments as defined by the appended claims. In addition, the Figures provided herein illustrate only portions of exemplary microelectronic devices and associated package structures that pertain to the practice of the embodiments. Thus the embodiments are not limited to the structures described herein.

What is claimed is:

1. A method of forming a device comprising:
   forming source/drain regions in a device substrate;
   alloying source/drain material of the source/drain regions with tin to reduce its band gap to close to zero, the source/drain material comprising germanium; and
   forming source/drain contacts to couple to the source/drain regions, wherein a small band gap of the alloyed region results in small metal contact resistance, wherein the alloyed region comprises $Ge_{0.7}Sn_{0.3}$, and wherein the device is ambipolar.

2. The method of claim 1 further comprising wherein a channel adjacent to the source/drain regions is a semiconductor with a band gap.

3. The method of claim 2 further comprising wherein the channel band gap is controlled by a gate bias.

4. The method of claim 1 further comprising wherein the device is formed from any semiconductor material, such as silicon, germanium, silicon germanium, or any III-V.

5. The method of claim 1 further comprising wherein the alloy material comprises a material that forms an alloy with the source/drain material, wherein the band gap of the alloyed region is reduced to close to zero electron volts by the addition of sufficient alloy concentration.

6. The method of claim 1 further comprising wherein the device comprises a hetero germanium and germanium tin PMOS device.

7. The method of claim 1 further comprising wherein the band gap between the source/drain regions and the source/drain contacts comprises zero at about 35 percent tin concentration when the source/drain is made of germanium.

8. The method of claim 1 further comprising wherein a channel adjacent the source/drain regions comprises a thickness below about 5 nm, and a source/drain tin concentration is greater than about 35 percent, wherein the source/drain comprises a thickness of about 20 nm.

9. A method of forming a device comprising:
   forming source/drain regions in a device substrate;
   alloying the source/drain material of the source/drain regions with an alloy material to reduce its band gap to close to zero; and
   forming source/drain contacts to couple to the source/drain regions, wherein a small band gap of the alloyed region results in small metal contact resistance, wherein a work function of the source/drain contacts comprises about 4.6 eV, wherein a channel band gap adjacent the source/drain regions can be modulated by an overlapping gate field.

10. A method of forming a device comprising:
    forming source/drain regions in a device substrate;
    alloying the source/drain material of the source/drain regions with an alloy material to reduce its band gap to close to zero; and
    forming source/drain contacts to couple to the source/drain regions, wherein a small band gap of the alloyed region results in small metal contact resistance, wherein the source/drain regions do not comprise a dopant.

11. A method of forming a structure comprising:
    forming source/drain regions in a device substrate, wherein the device substrate comprises a gate structure comprising a channel region, wherein the channel region is disposed between the source/drain regions; and alloying the source/drain regions with sufficient alloy material, wherein the source/drain regions do not comprise a dopant.

12. The method of claim 11 further comprising wherein the channel comprises an intrinsic $Si_xGe_y$ material, with all possible x/y combinations.

13. The method of claim 11 further comprising wherein the source/drain regions comprise a $Si_xGe_ySn_{1-x-y}$ composition.

14. A device structure comprising:
a gate structure disposed on a gate dielectric;
source/drain contacts disposed adjacent the gate structure;
source/drain regions disposed adjacent the source/drain contacts; and
a channel region disposed between the source drain regions, wherein the source drain regions do not comprise a dopant material, wherein the source/drain regions comprise an alloy material.

15. The structure of claim 14 further comprising wherein the alloy material comprises a tin material.

16. The structure of claim 15 further comprising wherein the tin material comprises greater than about 30 percent in the source/drain regions.

17. The structure of claim 14 further comprising wherein there is little to no band gap at the source/drain-contact interface.

18. The structure of claim 14 further comprising wherein the source/drain comprises a thickness of greater than about 20 nm, and wherein the channel comprises a thickness of less than about 5 nm.

19. The device structure of claim 14 further comprising a system comprising:

a bus communicatively coupled to the device structure; and
an eDRAM communicatively coupled to the bus.

20. A device structure comprising:
a gate structure disposed on a gate dielectric;
source/drain contacts disposed adjacent the gate structure;
source/drain regions disposed adjacent the source/drain contacts; and
a channel region disposed between the source drain regions, wherein the source drain regions do not comprise a dopant material, wherein the channel region comprises an intrinsic silicon, germanium, or silicon-germanium material.

21. A device structure comprising:
a gate structure disposed on a gate dielectric;
source/drain contacts disposed adjacent the gate structure;
source/drain regions disposed adjacent the source/drain contacts; and
a channel region disposed between the source drain regions, wherein the source drain regions do not comprise a dopant material, wherein the device is an ambipolar device.

22. A device structure comprising:
a gate structure disposed on a gate dielectric;
source/drain contacts disposed adjacent the gate structure;
source/drain regions disposed adjacent the source/drain contacts; and
a channel region disposed between the source drain regions, wherein the source drain regions do not comprise a dopant material, wherein a work function of the source/drain contact metal comprises a midgap value between the Ec and the Ev of the source/drain region.

* * * * *